(12) United States Patent
Huber et al.

(10) Patent No.: US 7,573,086 B2
(45) Date of Patent: Aug. 11, 2009

(54) TAN INTEGRATED CIRCUIT (IC) CAPACITOR

(75) Inventors: Michael LeRoy Huber, Sachse, TX (US); Gregory Lee Hendy, Murphy, TX (US); Evelyn Anne Lafferty, Frisco, TX (US); George Nicholas Harakas, Garland, TX (US); Salvatore Frank Pavone, Murphy, TX (US); Blake Ryan Pasker, Wylie, TX (US); Courtney Michael Hazelton, Dallas, TX (US); James Wayne Klawinsky, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 52 days.

(21) Appl. No.: 11/212,455

(22) Filed: Aug. 26, 2005

(65) Prior Publication Data

US 2007/0045774 A1    Mar. 1, 2007

(51) Int. Cl.
*H01L 29/94* (2006.01)

(52) U.S. Cl. .................. 257/306; 257/532; 257/535; 257/E21.396; 438/437; 427/79

(58) Field of Classification Search ................. 438/437, 438/396; 257/306; 427/79
See application file for complete search history.

(56) References Cited

U.S. PATENT DOCUMENTS

| | | | | |
|---|---|---|---|---|
| 5,652,176 A | * | 7/1997 | Maniar et al. | ............... 438/437 |
| 6,012,336 A | * | 1/2000 | Eaton et al. | .................... 73/754 |
| 6,117,747 A | * | 9/2000 | Shao et al. | .................. 438/396 |
| 6,686,237 B1 | | 2/2004 | Wofford et al. | |
| 6,710,391 B2 | * | 3/2004 | Houston | ..................... 257/306 |
| 6,806,196 B2 | | 10/2004 | Wofford et al. | |
| 6,872,659 B2 | | 3/2005 | Sinha | |
| 6,900,128 B2 | | 5/2005 | Sinha | |
| 6,960,365 B2 | * | 11/2005 | Ning | ............................ 427/79 |

\* cited by examiner

*Primary Examiner*—Evan Pert
*Assistant Examiner*—Scott R Wilson
(74) *Attorney, Agent, or Firm*—Wade J. Brady, III; Frederick J. Telecky, Jr.

(57) ABSTRACT

A capacitor is disclosed that is formed as part of an integrated circuit (IC) fabrication process. The capacitor generally comprises a top conductive plate, a capacitor dielectric and a bottom conductive plate that respectively comprise a patterned layer of tantalum nitride TaN, a layer of a nitride based material and a layer of patterned polysilicon.

19 Claims, 4 Drawing Sheets

TAN INTEGRATED CIRCUIT (IC) CAPACITOR

FIELD OF INVENTION

The present invention relates generally to semiconductor technology, and more particularly to an integrated circuit (IC) capacitor formed utilizing tantalum nitride (TaN).

BACKGROUND OF THE INVENTION

It can be appreciated that several trends presently exist in the electronics industry. Devices are continually getting smaller, faster and require less power, while simultaneously being able to support and perform a greater number of increasingly complex and sophisticated functions. One reason for these trends is an ever increasing demand for small, portable and multifunctional electronic devices. For example, cellular phones, personal computing devices, and personal sound systems are devices which are in great demand in the consumer market. These devices rely on one or more small batteries as a power source and also require an ever increasing computational speed and storage capacity to store and process data, such as digital audio, digital video, contact information, database data and the like.

Accordingly, there is a continuing trend in the semiconductor industry to manufacture integrated circuits (ICs) with higher device densities. To achieve such high densities, there has been and continues to be efforts toward scaling down dimensions (e.g., at submicron levels) on semiconductor wafers. In order to accomplish such high densities, smaller feature sizes, smaller separations between features and layers, and/or more precise feature shapes are required, such as metal interconnects or leads, for example. The scaling-down of integrated circuit dimensions can facilitate faster circuit performance and/or switching speeds, and can lead to higher effective yields in IC fabrication processes by providing more circuits on a semiconductor die and/or more die per semiconductor wafer, for example.

By way of example, high precision analog integrated circuits (IC's), such as analog-to-digital and digital-to-analog converters, for example, often require a number of capacitors for proper operation. Some of the capacitor requirements in a true eighteen bit converter IC, for example, are a ratio stability of less than 0.00075% over 10 years, a voltage coefficient of less than 10 ppm per volt, a temperature drift match of less than 0.05% per degree Celsius, dielectric absorption of less than 0.00075% and capacitance greater than 0.5 fF per square micrometer, among other things.

Such integrated circuit capacitors are generally formed as part of the IC fabrication process whereby a thin dielectric layer is established between two conductive plates. However, conventional IC fabrication techniques, such as patterning and/or etching, for example, have limitations as to the size and/or accuracy to which features can be produced thereby. It would, therefore, be desirable to be able to form one or more integrated circuit capacitors in a cost effective manner that allows smaller feature sizes to be more accurately produced without complicating the fabrication process so that device scaling can be furthered.

A crucial limitation in manufacturing high precision integrated circuit capacitors is the formation of the capacitor plates. In manufacturing the capacitors, the conductive plates are formed by etching one or more conductive layers to a desired shape. Current etch techniques limit the precision of the capacitors so formed by producing nonlinear etch profiles, by leaving filaments of the material being etched, by trenching the surface of the integrated circuit, and by damaging the capacitor dielectric layer at the edge of the capacitor. There is therefore a need for a method to form high precision integrated circuit capacitors that is not limited by conventional etching constraints.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to an integrated circuit (IC) capacitor formed in an efficient manner that allows smaller feature sizes to be more accurately produced. In particular, the capacitor is formed utilizing a layer of tantalum nitride (TaN) for a top plate of the capacitor. The materials utilized to form the capacitor are commonly found in IC fabrication process, and, as such, the capacitor can be accurately and precisely produced in a cost effective manner that allows feature sizes to be reduced.

According to one or more aspects of the present invention, a TaN capacitor is disclosed. The capacitor includes a bottom conductive plate, a capacitor dielectric located over the bottom conductive plate, and a top conductive plate located over the capacitor dielectric, where the top conductive plate comprises TaN, and where the capacitor is formed on a semiconductor substrate.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
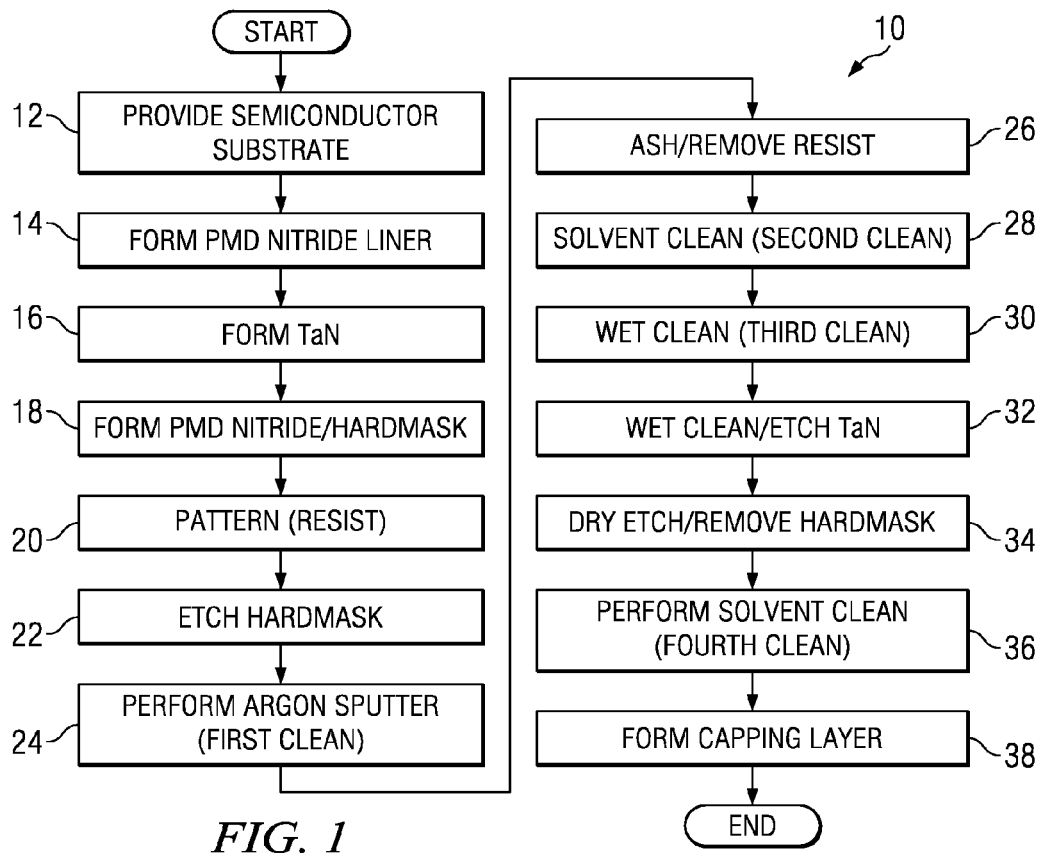
FIG. 1 is a flow diagram illustrating an exemplary methodology for forming an integrated circuit (IC) capacitor in accordance with one or more aspects of the present invention.

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

Turning to FIG. 1, an exemplary methodology 10 is illustrated for forming a capacitor according to one or more aspects of the present invention. Although the methodology 10 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein.

Figure 2:
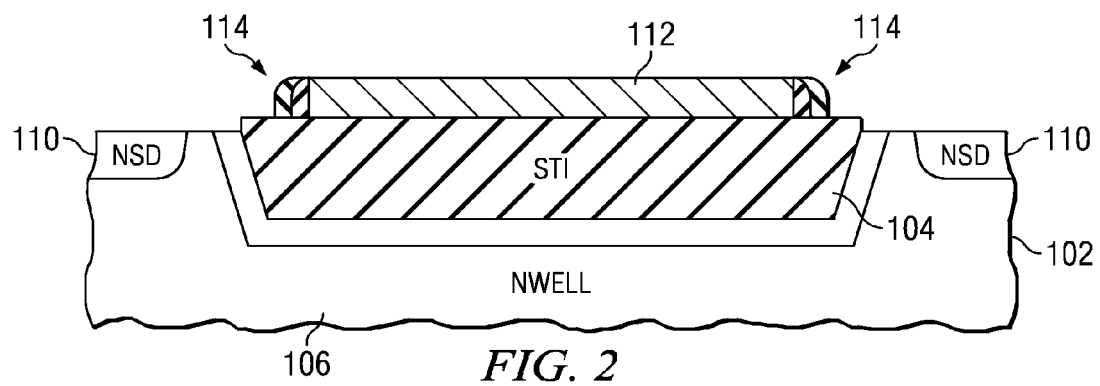
FIGS. 2-11 are cross-sectional illustrations of a capacitor being formed according to one or more aspects of the present invention, such as the methodology set forth in FIG. 1.

The methodology 10 begins at 12 wherein a semiconductor substrate 102 is provided, where the substrate 102 has an isolation region 104 formed therein, and where, in the illustrated example, the isolation region 104 has step height of around 600 angstroms, for example, above the surface of the substrate 102 (FIG. 2). In the illustrated example, the isolation region 104 comprises shallow trench isolation (STI), but may comprise any suitable type of isolation, such as local oxidation of silicon (LOCOS), etc. The isolation region 104 is formed within an NWELL 106 in the substrate 102 in the illustrated example, where such an NWELL 106 is generally established by (previously) implanting an n type dopant into the substrate 102. Similarly, n type source/drain regions 110 are established in the substrate 102 (e.g., via doping), with the isolation region 104 situated between the source/drain regions 110. Also, a layer of patterned conductive material 112 with sidewall spacers 114 on either side is established over the isolation region 104. The conductive material 112 generally comprises polysilicon that is used to establish transistor gate electrodes on other areas of the substrate 102 (not shown), and the sidewall spacers 114 assist with forming source/drain regions 110 and/or source/drain extension regions (not shown) in these other areas of the substrate 102.

It is to be appreciated that substrate or semiconductor substrate as used herein can include a base semiconductor wafer or any portion thereof (e.g., one or more wafer die) as well as any epitaxial layers or other type of semiconductor layers formed thereover and/or associated therewith. The substrate 102 can comprise, for example, silicon, SiGe, GaAs, InP and/or SOI. In addition, the substrate 102 can include various device elements formed therein such as transistors, for example, and/or layers thereon. These can include metal layers, barrier layers, dielectric layers (e.g., inter level dielectric (ILD)), device structures, including silicon gates, word lines, source regions, drain regions, bit lines, bases, emitters, collectors, conductive lines, conductive vias, etc.

Figure 3:
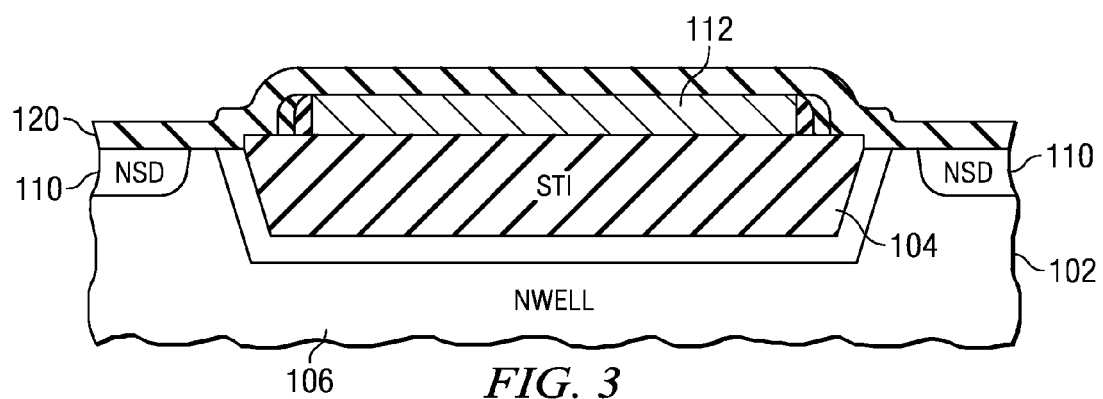
Figure 4:
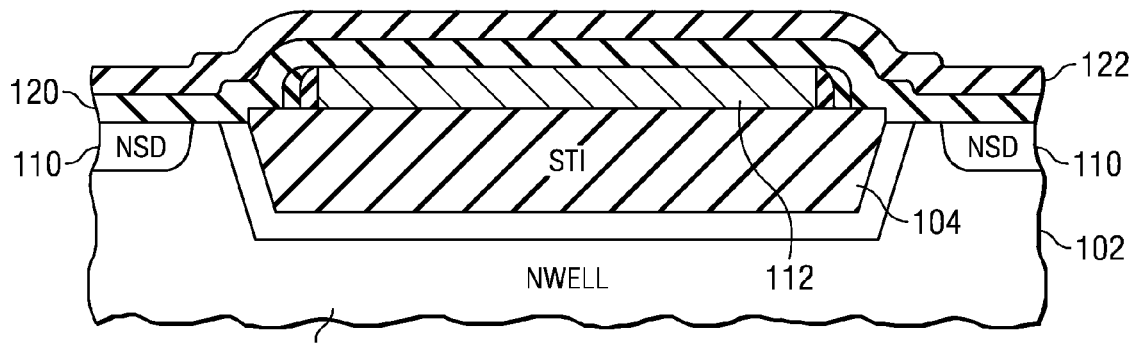

The methodology 10 then advances to 14 where a layer of nitride based material 120 is formed (FIG. 3). In one example, the layer of nitride material 120 comprises a poly metal dielectric (PMD) nitride liner that is formed to a thickness of between about 400 angstroms and about 500 angstroms, for example. At 16, a layer of tantalum nitride (TaN) 122 is then formed over the nitride layer 120 (FIG. 4). The TaN layer 122 can be formed to a thickness of between about 580 angstroms and about 780 angstroms, for example, by a deposition and/or sputtering process, for example. Further, the layer of TaN 122 can be formed in the presence of between about zero percent and about 30 percent nitrogen, for example, to mitigate nitride saturation/poisoning. Mitigating nitride saturation (e.g., by controlling the flow rate of nitrogen added to the processing chamber) is advantageous because it serves to make the TaN more amenable to subsequent etching (e.g., by making the resulting TaN softer or less hard). Additionally, the flow rate of nitrogen is generally maintained relatively constant to mitigate the formation of striations.

Figure 5:
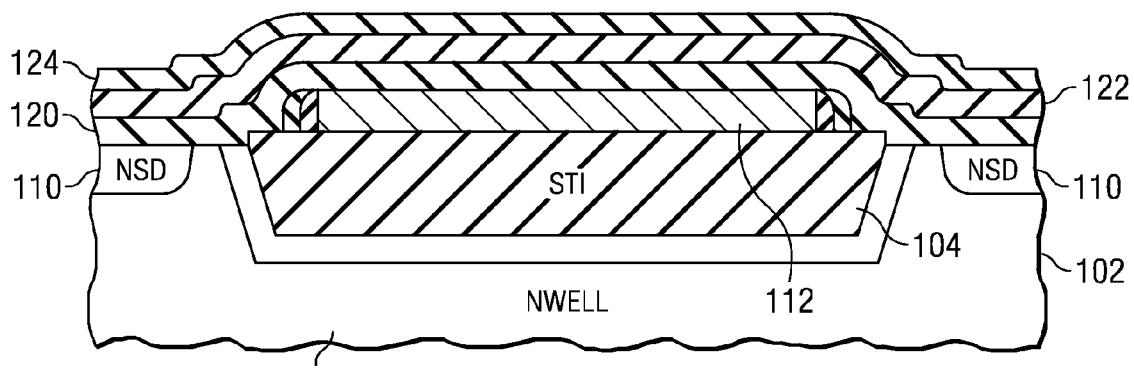

At 18, a layer of PMD nitride material 124 is formed over the layer of TaN 122 (FIG. 5). In one example, the layer of PMD nitride 124 is formed to a thickness of between about 270 angstroms and about 330 angstroms, for example, without moving the substrate 102 to another processing chamber (e.g., formation of the PMD nitride layer 124 occurs within the same processing chamber). As will be appreciated the layer of PMD nitride material 124 will be employed as a hardmask for subsequent etching that is performed on the layer of TaN 122.

Figure 6:
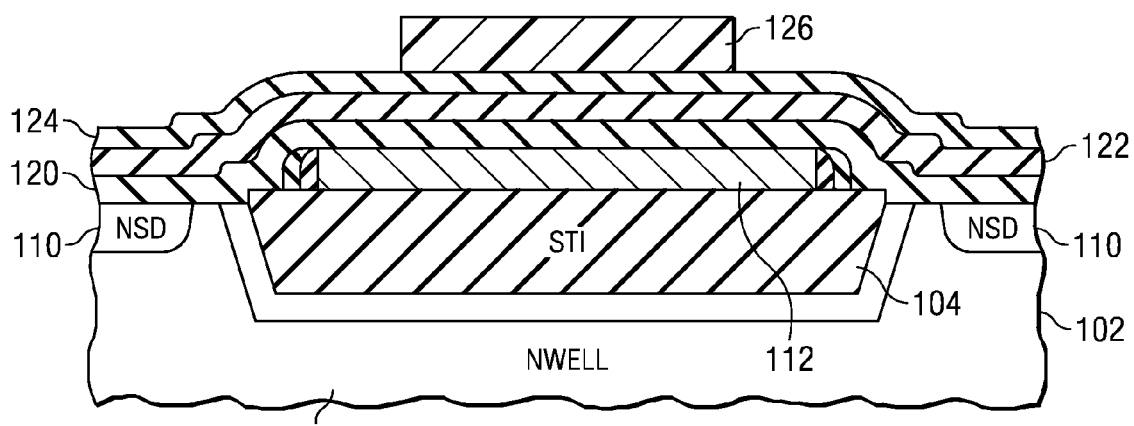

A layer of resist material 126 is then formed and patterned over the layer of PMD nitride 124 at 20 (FIG. 6). More particularly, the layer of resist material 126 is patterned to implement lithographic techniques, where lithography refers to processes for transferring one or more patterns between various media. In lithography, a radiation sensitive resist coating is formed over one or more layers to which a pattern is to be transferred. The resist is itself first patterned by exposing it to type(s) of radiation, where the radiation (selectively) passes through an intervening mask containing the pattern. As a result, the exposed or unexposed areas of the resist coating become more or less soluble, depending on the type of resist used. A developer is then used to remove the more soluble areas leaving the patterned resist. The pattered resist 126 can then serve as a mask for the underlying layers which can be selectively etched to transfer the pattern thereto.

Figure 7:
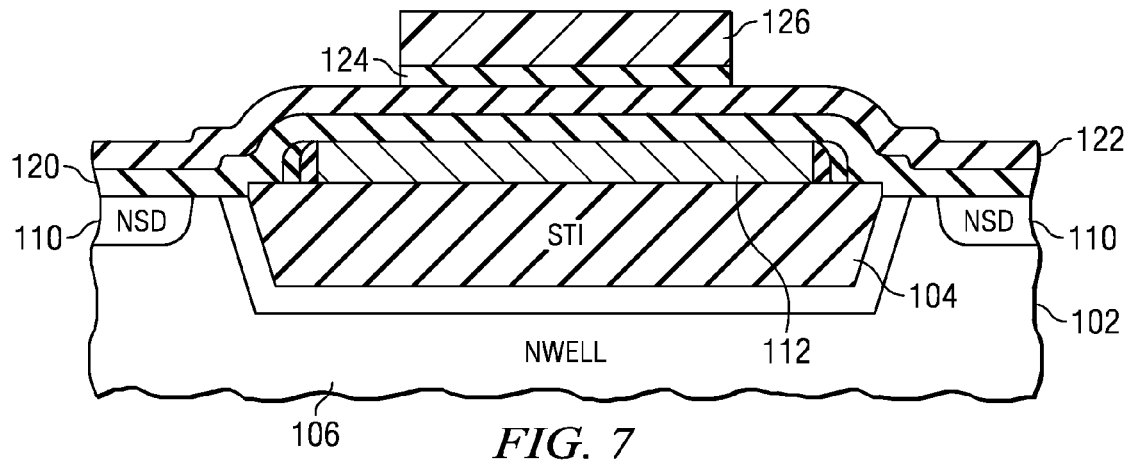

The layer of PMD nitride material 124 or hardmask is then etched at 22 via a dry etching process with the patterned resist 126 serving as a mask (FIG. 7). After the hardmask 124 is etched through and the layer of TaN 122 is revealed, an argon sputter is performed at 24 to remove polymer residue (not shown) from the surface of the TaN 122 (FIG. 7). It will be appreciated that the substrate 102 continues to remain in the same processing chamber for the argon sputter. It will also be appreciated that it is important to remove polymer reside from the layer of TaN 122 because such residue will inhibit subsequent wet etching processes if not removed.

Figure 8:
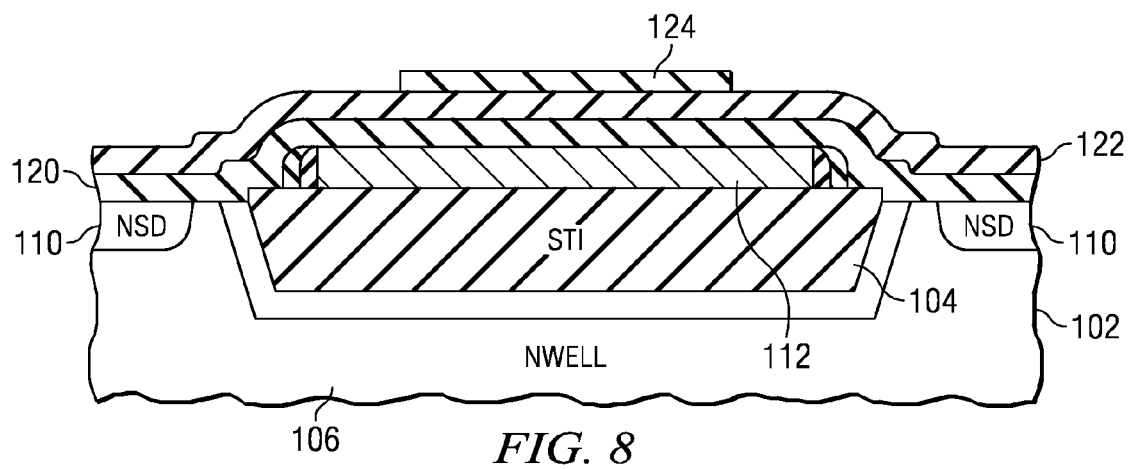

At 26, an in situ ash of the patterned resist 126 is performed in the same processing tool (FIG. 8). Preferably, the in situ ash is performed on a cooled chuck (e.g., between about 115 degrees Celsius and about 125 degrees Celsius), while a vacuum is maintained when the substrate 102 is transferred to the ash chamber. This serves to mitigate any hardening of resist polymers, and thereby facilitates ease of their subsequent removal.

Once the patterned resist 126 is removed, a solvent clean is performed at 28 to remove polymers (FIG. 8). It will be appreciated that this cleaning process may remove a little of the hardmask nitride 124. For example, about 40 angstroms of the hardmask nitride 124 may be removed so that about 260 angstroms of the patterned PMD nitride hardmask 124 remain over the TaN 122. The surface of the TaN 122 is the then cleaned at 30 (FIG. 8). This may comprise an FSI wet clean, an SC1 clean and/or a Piranha clean, for example, and may further comprise ammonia hydroxide-hydrogen peroxide-water mixture (e.g., 0.25:1:5 at between about 40 decrees Celsius and about 70 degrees Celsius).

Figure 9:
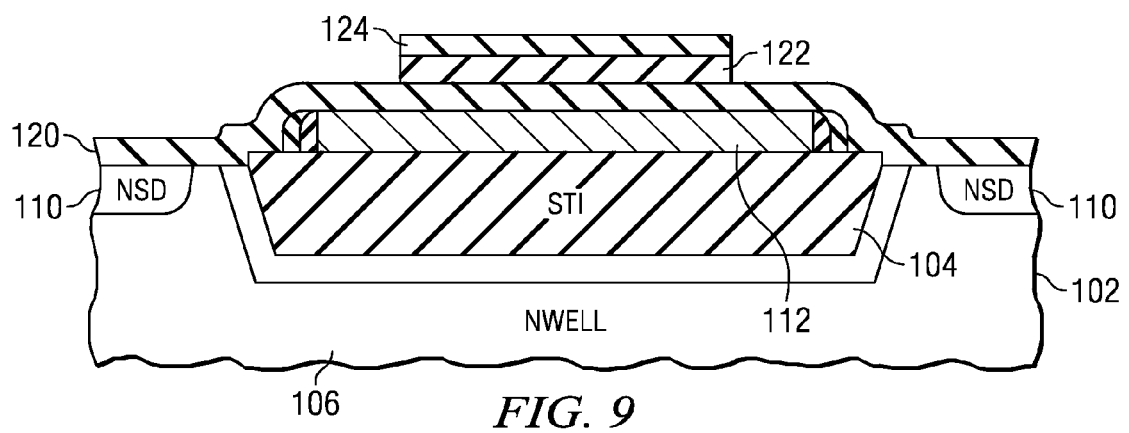

The TaN 122 is then etched at 32 (FIG. 9). This may be performed in a hooded FSI and may comprise a hot SC1 wet clean, for example, performed for between about 35 minutes and about 75 minutes at concentrations that are about 30 times as great as the concentrations utilized in the previous clean performed at 30, for example. Although serving as a mask, a little more of the PMD nitride hardmask 124 may be removed during this cleaning/etching process. For example, about 100 angstroms of the hardmask nitride 124 may be removed during this etch/clean so that about 160 angstroms of the patterned PMD nitride hardmask 124 remain over the TaN 122.

Figure 10:
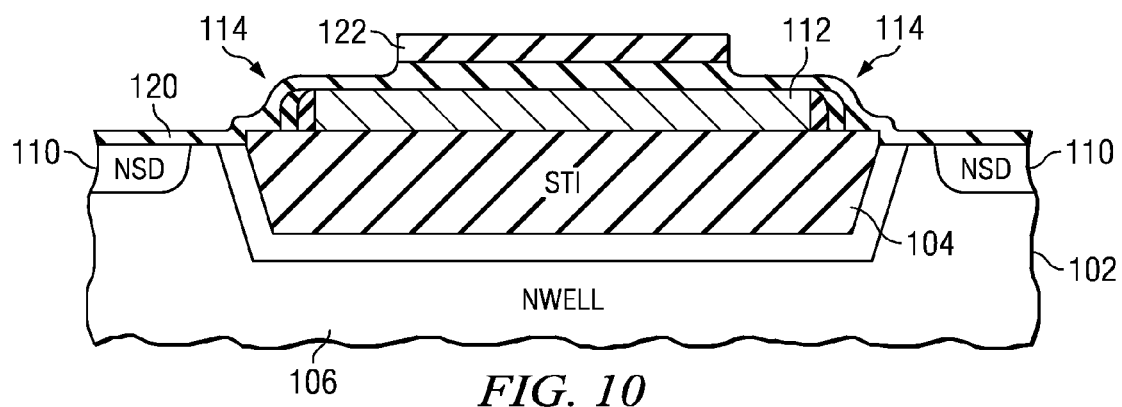

Another etching process, such as a dry etching process, for example, is then performed at 34 to remove the nitride hardmask 124 from atop the TaN 122 (FIG. 10). It will be appreciated that this etching process also removes some of the exposed nitride liner 120. Accordingly, this etching process is controlled so that the nitride hardmask 124 is partially removed, but the nitride liner 120 is not etched through so that the silicon 102 is not etched. As such, preferably merely about 160 angstroms of material are removed. This is sufficient to remove most of the hardmask 124, but not to completely etch through the nitride liner 120 at certain locations where the liner 120 may be substantially thinner than the about 450 angstroms, for example, of nitride 120 under the TaN 122. Although not illustrated, nonconformal and/or flowing properties, for example, of the nitride liner 120 may cause the liner 120 to be about a hundred or more angstroms thinner around certain feature corners, such as around the sidewall spacers 114, for example.

Figure 11:
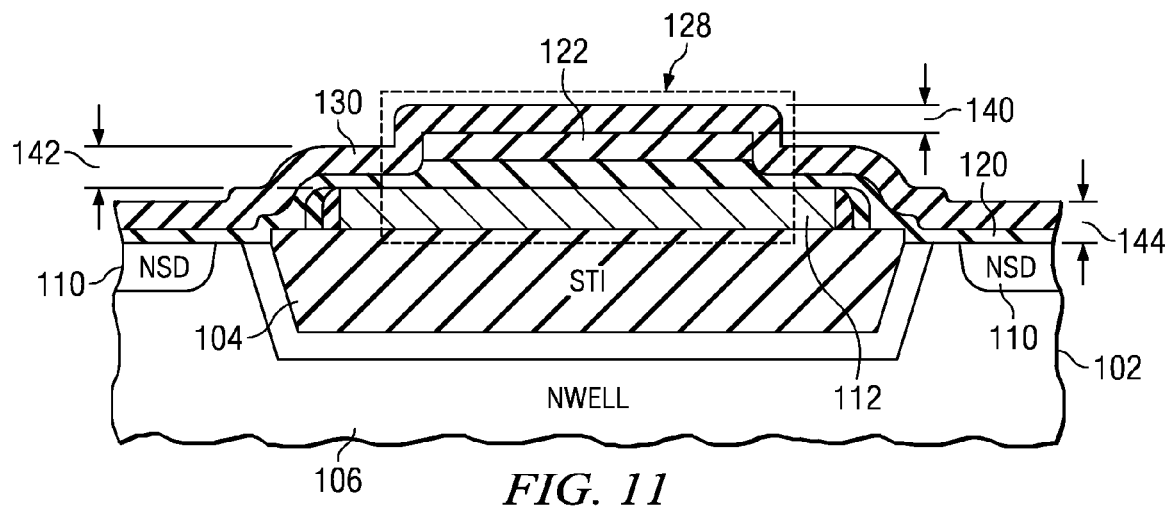

At this point the capacitive structure 128 is generally complete with the TaN 122 serving as the top conductive plate, the nitride liner 120 serving as the capacitor dielectric and the conductive polysilicon 112 serving as the bottom conductive plate of the capacitor. Another solvent clean can then be performed at 36, followed by the formation of a layer of capping material 130 at 38 (FIG. 11). The solvent clean may comprise a multi-pass cryo-clean followed by a short piranha/FSI to remove overhanging nitride material that can result from non uniformities associated with depositing and/or etching the nitride hardmask material 124. The clean may further comprise utilizing an ammonia hydroxide-hydrogen peroxide-water mixture (e.g., 0.25:1:5) at between about 40 decrees Celsius and about 70 degrees Celsius, for example. In one example, the layer of capping material 130 comprises a poly metal dielectric nitride that is formed (e.g., deposited) to a thickness of between about 250 angstroms and about 350 angstroms, for example.

Figure 12:
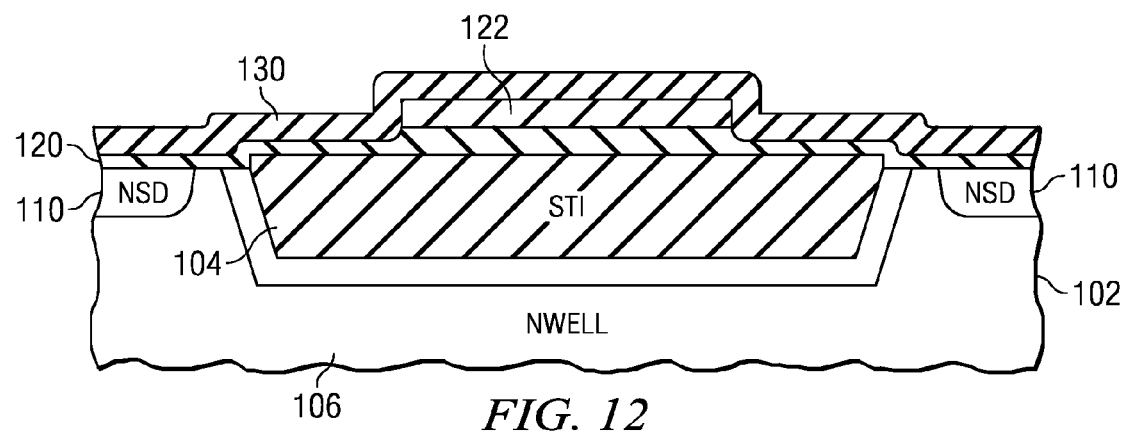
FIG. 12 is a cross-sectional illustration of a TaN resistor formed according to one or more aspects of the present invention.

It is to be appreciated that while the discussion herein has thus far referred to the use of TaN to produce a capacitor in a semiconductor fabrication process, the treatment or manipulation of TaN disclosed herein (e.g., in a controlled manner implementing wet etching), can be used to create other features and/or semiconductor devices as well (which may or may not be over isolation regions, such as region 104). For example, a TaN resistor can be created by processing TaN as described herein. FIG. 12 illustrates such a situation, where the TaN 122 is not formed over (patterned) polysilicon 112 and/or sidewall spacers 114. Instead, the TaN is formed over the first layer of nitride based material 120 which, in the illustrated example, is formed directly over the isolation region 104. Nevertheless, the TaN can still be said to overlie a conductive region of the substrate since the semiconductor substrate 102 is itself generally somewhat conductive, and may comprise one or more regions that are even more conductive, such as the NWELL 106, for example. By subsequently forming a contact (not shown) down to the TaN 122, the TaN can be utilized as a resistor. It will be appreciated that the aforementioned dimensions and/or thicknesses of the layers can remain generally the same when forming a resistor, for example. This is merely another example of how TaN can be utilized in a semiconductor fabrication process in accordance with one or more aspects of the present invention (e.g., patterned via wet etching) so that it can be applied to a planar area without creating TaN filaments in non planar topology areas, such as over polysilicon lines, for example.

The methodology 10 may then advance for further back end processing (not shown), where, for example, further patterning can be performed as well as forming conductive contacts down to conductive layers. It can be appreciated that the relative uniformity of nitride material makes subsequent etching for conductive contacts easier as it mitigates the likelihood of (undesirably) etching through the nitride material and into underlying layers. For example, at this point the nitride capping layer generally has a thickness 140 of between about 250 angstroms and about 350 angstroms, and the respective thicknesses 142, 144 of the nitride material overlying the polysilicon 112 and moat 106 regions are between about 350 angstroms and about 450 angstroms, for example. Further, the TaN material 122 serves as etch stop when etching for contacts (e.g., very little of top capacitor plate gets etched into).

It is to be appreciated that TaN has not heretofore been used in forming a capacitor or other semiconductor devices, such as a resistor, for example, as part of an integrated circuit fabrication process due to, among other things, the formation of undesirable polymers which are difficult to remove and which can lead to degraded performance in resulting devices. The difficulties associated with utilizing TaN have generally restricted conventional uses of TaN to that of a barrier metal in copper trenches in a back end of the line (BEOL) fabrication process.

Accordingly, TiN has generally been used to form semiconductor devices, such as capacitors. However, TiN can be somewhat columner or tubular when it is deposited, and etching such a 'straw like' material can be problematic. For example, ragged edges, undercuts and/or overetching can result from etching TiN. By way of contrast, a nitride based material is used for a hardmask (as opposed to an oxide based material as the case may be with TiN) to withstand etching/etchants necessary to reliably and predictably etch TaN in forming semiconductor devices according to one or more aspects of the present invention. Similarly, a nitride based material (as opposed to an oxide for TiN) is used in forming a capacitor dielectric according to one or more aspects of the present invention, where the nitride is generally used in forming a negative bias temperature instability (NBTI) layer in fabrication processes to mitigate shifts in Vt's of transistors. Further, in fashioning semiconductor devices in accordance with one or more aspects of the present invention, the devices are finally encapsulated within a layer of nitride based material (as opposed to a layer of oxide based material for TiN) to keep the TaN from reacting with other layers, materials, etc., such as oxide, for example. The use of TaN for a top conductive plate on a capacitor also allows the plate to be reduced in thickness by about 67% as compared to when TiN is used. This leads to shallower contact integration which can improve contact reliability, among other things. Additionally, unlike TiN, TaN is a barrier to copper, and so it mitigates (undesirable) copper drift.

It will be appreciated that while reference is made throughout this document to exemplary structures in discussing aspects of methodologies described herein (e.g., those structures presented in FIGS. 2-11 while discussing the methodology set forth in FIG. 1), that those methodologies are not to be limited by the corresponding structures presented. Rather, the methodologies (and structures) are to be considered independent of one another and able to stand alone and be practiced without regard to any of the particular aspects depicted in the FIGS.

Although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

Also, the term "exemplary" is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques and/or deposition techniques such as chemical vapor deposition (CVD), physical vapor deposition (PVD) and/or plasma enhanced chemical vapor deposition (PECVD), or atomic layer deposition (ALD), for example, and can be patterned in any suitable manner (unless specifically indicated otherwise), such as via etching and/or lithographic techniques, for example.

What is claimed is:

1. A semiconductor structure having a cross section comprising:
    a dielectric layer within a semiconductor substrate; and
    a TaN capacitor having a portion overlying the dielectric layer and comprising:
        a bottom conductive plate on the dielectric layer and electrically isolated from the semiconductor substrate by the dielectric layer;
        a capacitor dielectric located in contact with the bottom conductive plate, wherein the capacitor dielectric comprises a poly metal dielectric (PMD) nitride liner; and
        a top conductive plate located in contact with the capacitor dielectric, where the top conductive plate comprises TaN and excludes copper, and where at least a portion of the capacitor is formed on the semiconductor substrate.

2. The capacitor of claim 1, wherein a capping layer of nitride based material is formed over the top conductive plate of the capacitor.
3. The capacitor of claim 2, wherein the capping layer has a thickness of between about 250 angstroms and about 350 angstroms.
4. The capacitor of claim 2, wherein the capping layer comprises a poly metal dielectric (PMD) nitride.
5. The capacitor of claim 1, wherein the capacitor dielectric has a thickness of between about 400 angstroms and about 500 angstroms.
6. The capacitor of claim 1, wherein the top conductive plate has a thickness of between about 580 angstroms and about 780 angstroms.
7. The capacitor of claim 1, wherein the top conductive plate is formed by at least one of a deposition process and a sputtering process.
8. The capacitor of claim 1, wherein the top conductive plate is formed in the presence of between about zero percent and about 30 percent nitrogen.
9. The capacitor of claim 1, wherein the bottom conductive plate comprises a patterned layer of polysilicon.
10. The capacitor of claim 1, wherein the capacitor is formed over an isolation region within the semiconductor substrate.
11. A TaN capacitor, comprising:
    a bottom conductive plate;
    a capacitor dielectric comprising a poly metal dielectric (PMD) nitride liner in contact with the bottom conductive plate; and
    a TaN top conductive plate located in contact with the capacitor dielectric.
12. The capacitor of claim 11, the top conductive plate excluding copper.
13. The capacitor of claim 12, wherein a capping layer of nitride based material is formed over the conductive plate of the capacitor.
14. The capacitor of claim 13, wherein the capping layer comprises a poly metal dielectric (PMD) nitride.
15. The capacitor of claim 14, wherein the top conductive plate is formed in the presence of between about zero percent and about 30 percent nitrogen.
16. The capacitor of claim 12, wherein the capping layer has a thickness of between about 250 angstroms and about 350 angstroms.
17. The capacitor of claim 16, wherein the top conductive plate is formed by at least one of a deposition process and a sputtering process.
18. The capacitor of claim 17, wherein the capacitor is formed over an isolation region within the semiconductor substrate.
19. A TaN capacitor formed over an isolation region within a semiconductor substrate, comprising:
    a bottom conductive plate;
    a capacitor dielectric located in contact with the bottom conductive plate;
    a TaN top conductive plate located in contact with the capacitor dielectric; and
    a poly metal dielectric (PMD) nitride capping layer over the top conductive plate of the capacitor.

* * * * *